(12) United States Patent
Tamaoka et al.

(10) Patent No.: US 7,233,052 B2
(45) Date of Patent: Jun. 19, 2007

(54) SEMICONDUCTOR DEVICE INCLUDING FINE DUMMY PATTERNS

(75) Inventors: Eiji Tamaoka, Hyogo (JP); Hideo Nakagawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/082,853

(22) Filed: Mar. 18, 2005

(65) Prior Publication Data

US 2005/0161824 A1    Jul. 28, 2005

Related U.S. Application Data

(60) Continuation of application No. 10/383,772, filed on Mar. 10, 2003, now Pat. No. 6,890,830, which is a division of application No. 09/899,860, filed on Jul. 9, 2001, now abandoned.

(30) Foreign Application Priority Data

Jul. 13, 2000    (JP) .............................. 2000-212285

(51) Int. Cl.
*H01L 29/00*    (2006.01)
*H01L 23/48*    (2006.01)

(52) U.S. Cl. ...................... 257/522; 257/758; 257/773
(58) Field of Classification Search ................ 257/522, 257/752, 758–760, 773–775
See application file for complete search history.

(56) References Cited

U.S. PATENT DOCUMENTS

| 5,519,250 | A | 5/1996 | Numata |
| 5,861,674 | A | 1/1999 | Ishikawa |
| 6,396,146 | B2 | 5/2002 | Nakayama |

FOREIGN PATENT DOCUMENTS

JP    08-181208    7/1996

*Primary Examiner*—Hung Vu
(74) *Attorney, Agent, or Firm*—Nixon Peabody LLP; Donald R. Studebaker (57) ABSTRACT

A semiconductor device of this invention includes a first interconnect pattern formed on a semiconductor substrate and a second interconnect pattern formed above the first interconnect pattern with an interlayer insulating film sandwiched therebetween. The first interconnect pattern includes a dummy pattern insulated from the first interconnect pattern, and the dummy pattern includes a plurality of fine patterns adjacent to each other and air gaps formed between the adjacent fine patterns.

5 Claims, 8 Drawing Sheets

UNIT: μm

SEMICONDUCTOR DEVICE INCLUDING FINE DUMMY PATTERNS

BACKGROUND OF THE INVENTION

The present invention relates to a semiconductor device having a multi-level interconnect structure, and more particularly, it relates to a semiconductor device including a dummy pattern useful in planarization of an interlayer insulating film formed on an interconnect pattern and a method for fabricating the same.

Recently, in accordance with improvement in integration and performance of semiconductor devices, interconnect patterns included in a device are refined and formed in multiple levels. Owing to the refinement and the multi-level structure of the interconnect patterns, a level difference caused on the top face of an interlayer insulating film has become large and abrupt, which degrades the processing accuracy and the reliability of the interconnect patterns.

In particular, a difference in the height (absolute height) between the top face of a wafer and the top face of an interlayer insulating film, namely, the so-called global level difference, is increased due to the multi-level structure of metal interconnects. Furthermore, since exposing light of a shorter wavelength is employed in the lithography as the device is more refined, the depth of focus becomes insufficient. As a result, the processing accuracy and the reliability of the interconnect patterns are degraded. As a planarization technique for an interlayer insulating film for reducing the global level difference, chemical mechanical polishing (CMP) is employed.

Furthermore, the refinement and the multi-level structure of the interconnect patterns in accordance with the increase in integration level of semiconductor devices can increase capacitance between interconnects. The increase of the capacitance between interconnects affects the operation speed of the semiconductor device, and hence, the capacitance between interconnects needs to be reduced. In order to reduce the capacitance between interconnects, an insulating material with a low dielectric constant is used, and in order to further reduce the capacitance between interconnects, an air gap interconnect structure where air gaps are provided between interconnect patterns are employed.

The air gap interconnect structure is reported in, for example, papers written by T. Ueda et al. (A Novel Air Gap Integration Scheme for Multi-level Interconnects using Self-aligned Via Plugs: 1988 Symposium on VLSI Technology Digest of Technical Papers, P. 46, 1998; and Integration of 3 Level Air Gap Interconnect for Sub-quarter Micron CMOS: 1999 Symposium on VLSI Technology Digest of Technical Papers, P. 111, 1999).

Also in the formation of air gap multi-level interconnects, it is necessary to planarize an interlayer insulating film. In the planarization by the CMP, a dummy pattern is disposed in a portion where interconnect patterns are relatively sparse.

A conventional semiconductor device having the an air gap interconnect structure including a dummy pattern used for the planarization of an interlayer insulating film will now be described with reference to accompanying drawings.

FIGS. 7A through 7C and 8A through 8C are cross-sectional views for showing procedures in a method for fabricating the conventional semiconductor device including an air gap interconnect pattern and a dummy pattern.

Figure 7A:
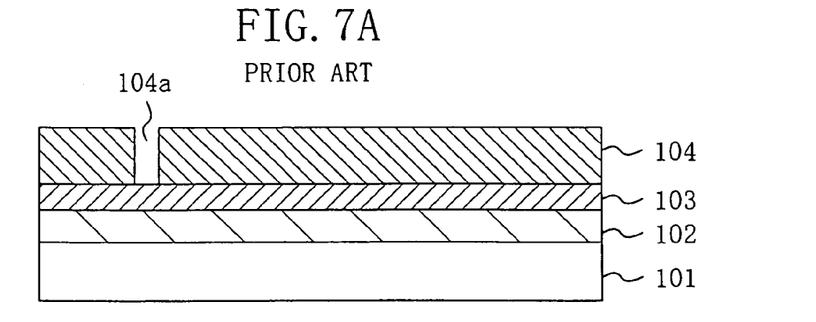
FIGS. 7A, 7B and 7C are cross-sectional views for showing procedures in a method for fabricating a conventional semiconductor device including an air gap interconnect pattern and a dummy pattern.

First, as shown in FIG. 7A, a first insulating film 102 of silicon oxide, a conducting film 103 of aluminum alloy and a second insulating film 104 of silicon oxide are successively deposited on a semiconductor substrate 101 of silicon. Subsequently, a contact hole 104a for exposing the conducting film 103 is selectively formed in the second insulating film 104.

Figure 7B:
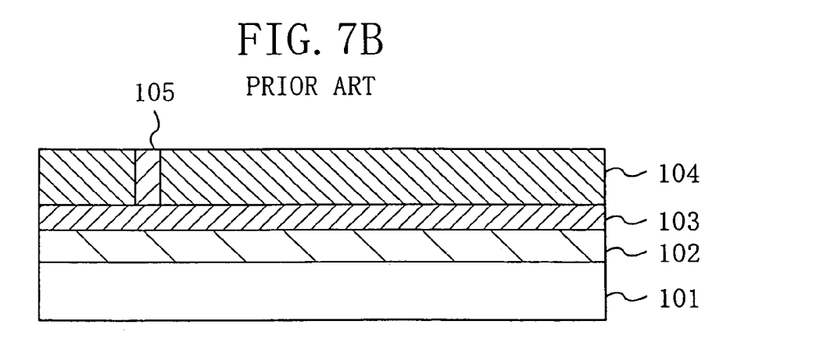

Next, as shown in FIG. 7B, the contact hole 104a is filled with tungsten, thereby forming a plug 105.

Figure 7C:
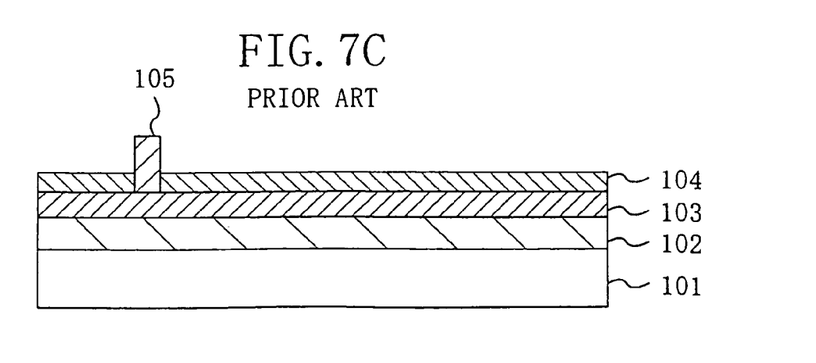

Then, as shown in FIG. 7C, the second insulating film 104 is etched back so as to expose an upper portion of the plug 105. The position of the top of an air gap subsequently formed in the interconnect pattern is determined by controlling the thickness of the second insulating film 104 remaining after the etch back.

Figure 8A:
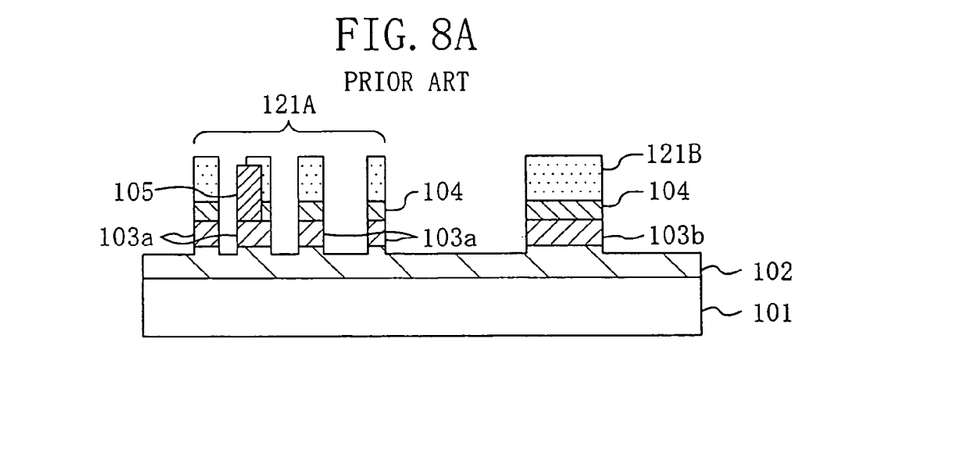
FIGS. 8A, 8B and 8C are cross-sectional views for showing other procedures in the method for fabricating the conventional semiconductor device including an air gap interconnect pattern and a dummy pattern.

Subsequently, as shown in FIG. 8A, a resist pattern 121A for a first interconnect pattern and a resist pattern 121B for a dummy pattern are formed on the second insulating film 104. With the resist patterns 121A and 121B and the plug 105 used as a mask, the second insulating film 104, the conducting film 103 and the first insulating film 102 are successively etched, thereby forming, from the conducting film 103, a first interconnect pattern 103a and a dummy pattern 103b having a square plane shape. At this point, a portion of the first insulating film 102 sandwiched between patterns of the first interconnect pattern 103a is trenched by the etching. Accordingly, an air gap can be easily formed from a space between the patterns and the position of the air gap from the substrate surface can be adjusted.

Figure 8B:
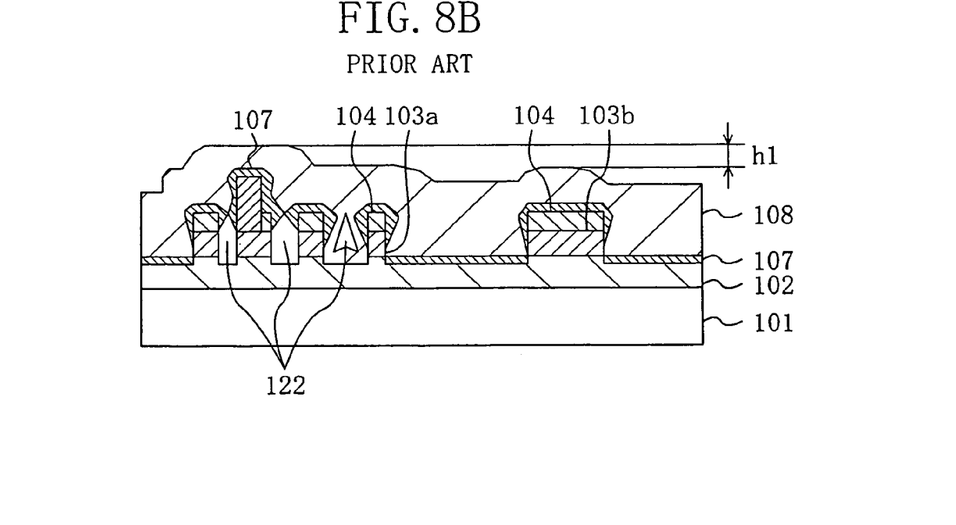

Next, as shown in FIG. 8B, after removing the resist patterns 121A and 121B, a third insulating film 107 of silicon oxide with low coverage and high directivity is deposited on the entire surface of the semiconductor substrate 101. Thereafter, a fourth insulating film 108 of silicon oxide with high coverage is formed. At this point, an air gap 122 is formed between the patterns of the first interconnect pattern 103a. Thus, the air gap interconnect structure is obtained.

Figure 8C:
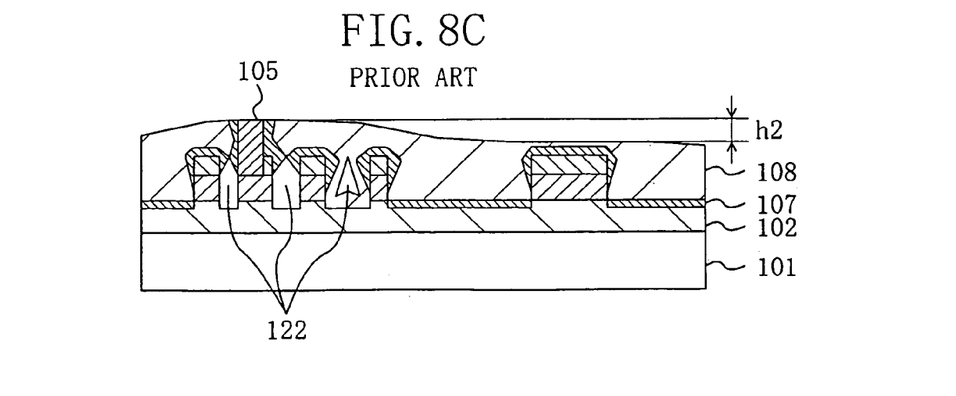

Then, as shown in FIG. 8C, the top face of the fourth insulating film 108 is polished and planarized by the CMP until the top face of the plug 105 is exposed.

In the fabrication method for the conventional semiconductor device, however, although the dummy pattern 103b is formed in a region where the first interconnect pattern 103a is relatively sparse on the semiconductor substrate 101, a difference h1 in the absolute height of the top face of the fourth insulating film 108 between a portion above the first interconnect pattern 103a and a portion above the dummy pattern 103b cannot be sufficiently small as shown in FIG. 8B. Therefore, even though the fourth insulating film 108 is planarized, there remains a difference h2 in the absolute height as shown in FIG. 8C. Thus, a sufficiently planar face cannot be attained.

When a second interconnect pattern is formed on the fourth insulating film 108 with such a difference h2 remaining, interconnects included in the second interconnect pattern may be disconnected due to the difference h2 or may fail due to high resistance. In order to more sufficiently planarize the top face of the fourth insulating film 108, a larger number of dummy patterns 103b may be provided. When a larger number of dummy patterns 103b are provided, however, capacitance between interconnect layers and between interconnects become so large that it is difficult to attain high operation speed. Therefore, the number of dummy patterns 103b is not preferably increased.

SUMMARY OF THE INVENTION

The invention was devised to overcome the aforementioned conventional problems, and an object is reducing a difference in the absolute height caused on the top face of an interlayer insulating film after planarization with the increase of capacitance between interconnect layers and between interconnects suppressed.

Figure 5A:
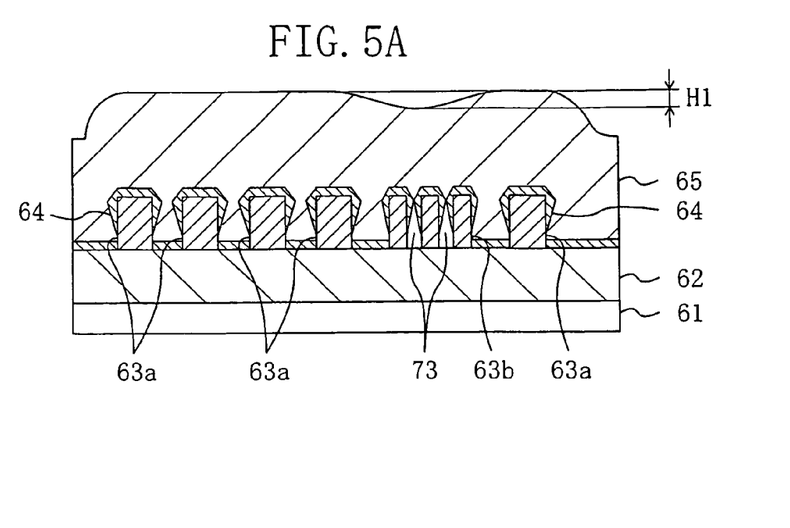
FIGS. 5A, 5B and 5C are cross-sectional views for showing other procedures in the method for fabricating a semiconductor device of Embodiment 2.
Figure 5B:
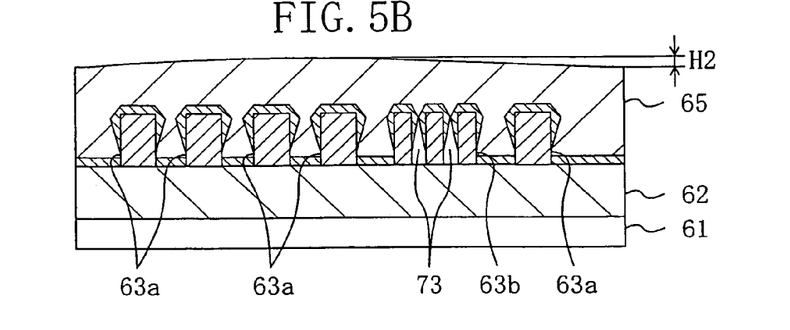

The present inventors have variously studied the reason why the difference h1 in the absolute height shown in FIG. 5B cannot be reduced to an allowable value in the conventional semiconductor device including the dummy pattern provided in a region where air gap interconnects are comparatively sparse, resulting in finding out the following cause:

In the air gap interconnect structure, since the air gap 122 is provided between the patterns of the first interconnect pattern 103a, the absolute height of a region where the first interconnect pattern 103a is relatively dense is larger than the absolute height of an interconnect pattern including no air gap. Accordingly, even though the dummy pattern 103b is formed in the region where the first interconnect pattern 103a is relatively sparse, the difference h1 in the absolute height from the portion above the dummy pattern is larger than that in the interconnect pattern including no air gap.

According to the invention, in order to reduce the difference h1 in the absolute height, a dummy pattern is formed as a plurality of fine patterns adjacent to each other with a space therebetween and the space is filled with nothing to form an air gap.

Specifically, the semiconductor device of this invention comprises a first interconnect pattern formed on a semiconductor substrate; and a second interconnect pattern formed above the first interconnect pattern with an interlayer insulating film sandwiched therebetween, and the first interconnect pattern includes a dummy pattern electrically insulated from the first interconnect pattern, and the dummy pattern includes a plurality of fine patterns adjacent to each other and air gaps sandwiched between the adjacent fine patterns.

In the semiconductor device of the invention, although the first interconnect pattern has the air gap interconnect structure where air gaps are formed between interconnect patterns, the absolute height of the top face of the interlayer insulating film in a portion above the dummy pattern is larger than that obtained without forming air gaps, and hence, a difference in the absolute height of the interlayer insulating film from a portion above the first interconnect pattern can be sufficiently small. Accordingly, even though the first interconnect pattern has the air gap structure, it can be sufficiently planarized by polishing, so that a good second interconnect pattern can be definitely formed on the sufficiently planarized interlayer insulating film without causing a defect such as disconnection. Moreover, since the dummy pattern itself has the air gap structure, the increase of the capacitance between interconnects and between interconnect layers due to the dummy pattern can be suppressed. Furthermore, when the dummy pattern of this invention is provided so as to attain capacitance between interconnect layers and between interconnects equivalent to those attained by a dummy pattern including no air gaps, a larger number of dummy patterns can be disposed in a region where the first interconnect pattern is comparative sparse. As a result, the interlayer insulating film can attain a further planar face.

In the semiconductor device, air gaps are preferably provided between adjacent patterns of the first interconnect pattern.

In the semiconductor device, the dummy pattern is preferably formed in a region on the semiconductor substrate where the first interconnect pattern is relatively sparse.

The first method for fabricating a semiconductor device of this invention comprises a first step of forming a first interconnect pattern forming layer from a conducting film on a semiconductor substrate and a first insulating film on the first interconnect pattern forming layer; a second step of forming a plug electrically connected to the first interconnect pattern forming layer by forming an opening in the first insulating film by selective etching and filling the opening with a conducting film; a third step of forming a resist pattern corresponding to a first interconnect pattern including a dummy pattern from a resist film applied over the semiconductor substrate including the plug; a fourth step of patterning the first insulating film by etching the first insulating film with the resist pattern and the plug used as a mask; a fifth step of forming, from the first interconnect pattern forming layer, the first interconnect pattern and the dummy pattern that is electrically insulated from the first interconnect pattern and includes a plurality of fine patterns adjacent to each other by etching the first interconnect pattern forming layer with the resist pattern and the plug used as a mask; a sixth step of forming, on the semiconductor substrate, a second insulating film covering the plug, the first interconnect pattern and the dummy pattern so as to form air gaps between patterns of the first interconnect pattern and between the fine patterns of the dummy pattern; and a seventh step of planarizing a top face of the second insulating film until the plug is exposed and forming, on the second insulating film, a second interconnect pattern electrically connected to the plug after planarization.

In the first method for fabricating a semiconductor device, the first interconnect pattern and the dummy pattern that is electrically insulated from the first interconnect pattern and includes a plurality of fine patterns adjacent to each other are formed from the first interconnect pattern forming layer, and thereafter, the second insulating film is formed so as to form air gaps between patterns of the first interconnect pattern and the fine patterns of the dummy pattern. Accordingly, a difference in the absolute height of the top face of the second insulating film between a portion above the dummy pattern and a portion above the first interconnect pattern can be sufficiently small. As a result, the difference in the absolute height is sufficiently small even after the planarization of the second insulating film, and hence, no failure is caused in the second interconnect pattern formed on the second insulating film sufficiently planarized. Furthermore, since the dummy pattern itself includes the air gaps, the increase of the capacitance between interconnects and between interconnect layers due to the dummy pattern can be suppressed.

In the method for fabricating a semiconductor device, the first step preferably includes a sub-step of forming an underlying insulating film on the semiconductor substrate before forming the first interconnect pattern forming layer, and the method preferably further includes, between the fifth step and the sixth step, a step of trenching an upper portion of the underlying insulating film by etching the underlying insulating film with the resist pattern and the plug used as a mask. In this manner, each space between the patterns of the first interconnect pattern and between the fine patterns of the dummy pattern can attain a high aspect ratio, and hence, the air gaps can be easily formed between the patterns in the sixth step. Furthermore, the position from the semiconductor substrate (height) of the air gap can be thus controlled.

The second method for fabricating a semiconductor device of this invention comprises a first step of forming a first interconnect pattern forming layer of a conducting film on a semiconductor substrate; a second step of forming a resist pattern corresponding to a first interconnect pattern including a dummy pattern from a resist film applied over the semiconductor substrate; a third step of forming, from the first interconnect pattern forming layer, the first interconnect pattern and the dummy pattern that is electrically insulated from the first interconnect pattern and includes a plurality of fine patterns adjacent to each other by etching the first interconnect pattern forming layer with the resist pattern used as a mask; a fourth step of forming, on the semiconductor substrate, an insulating film covering the first interconnect pattern and the dummy pattern so as to form air gaps between the fine patterns of the dummy pattern; a fifth step of planarizing a top face of the insulating film and forming a plug electrically connected to the first interconnect pattern by forming an opening in the insulating film after planarization by selective etching and filling the opening with a conducting film; and a sixth step of forming, on the insulating film, a second interconnect pattern electrically connected to the plug.

In the second method for fabricating a semiconductor device, the first interconnect pattern and the dummy pattern that is electrically insulated from the first interconnect pattern and includes a plurality of fine patterns adjacent to each other are formed from the first interconnect pattern forming layer, and thereafter, the insulating film is formed so as to form air gaps between the fine patterns of the dummy pattern. Therefore, a difference in the absolute height of the top face of the insulating film between a portion above the dummy pattern and a portion above the first interconnect pattern can be sufficiently small. As a result, the difference in the absolute height can be sufficiently small even after the planarization of the insulating film, and hence, no failure is caused in the second interconnect pattern formed on the insulating film sufficiently planarized. In addition, since the dummy pattern itself includes the air gaps, the increase of the capacitance between interconnects and between interconnect layers due to the dummy pattern can be suppressed.

BRIEF DESCRIPTION OF THE DRAWINGS

FIGS. 1A and 1B are diagrams of a mask used in fabrication of a semiconductor device according to Embodiment 1 of the invention, wherein

DETAILED DESCRIPTION OF THE INVENTION

EMBODIMENT 1

Embodiment 1 of the invention will now be described with reference to the accompanying drawings.

Figure 1A:
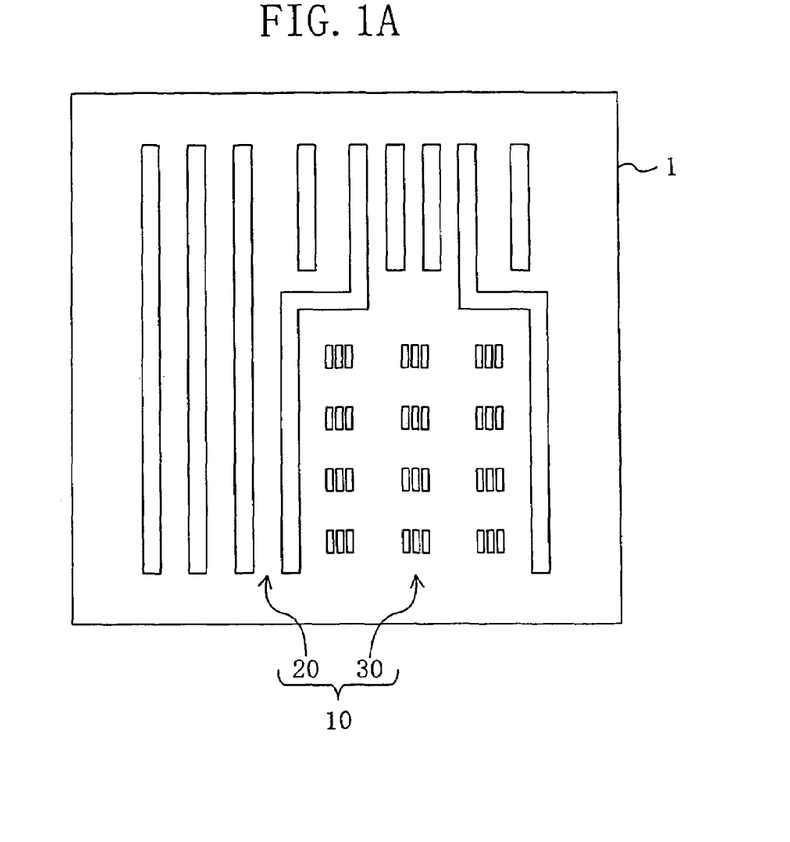
FIG. 1A is a plane view of an interconnect pattern and a dummy pattern and FIG. 1B is an enlarged plane view of the dummy pattern.
Figure 1B:
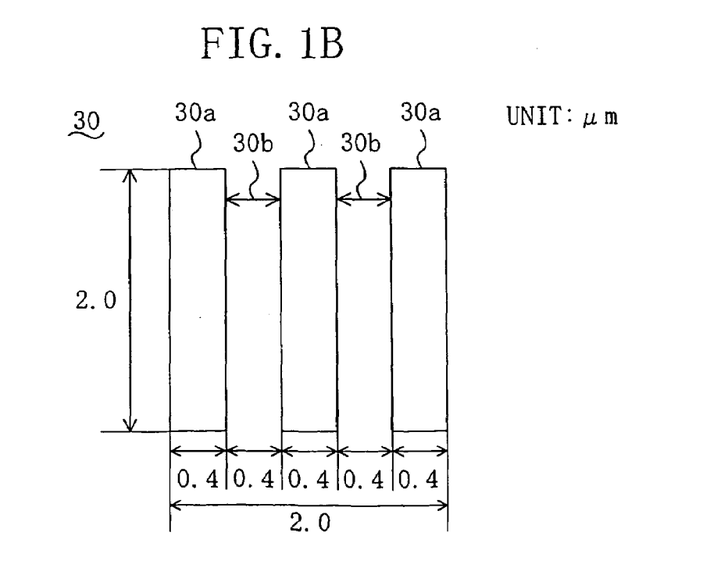

FIGS. 1A and 1B show a mask used in fabrication of a semiconductor device according to Embodiment 1 of the invention, wherein FIG. 1A is a plane view of an interconnect pattern and a dummy pattern and FIG. 1B is an enlarged plane view of the dummy pattern.

As shown in FIG. 1A, the interconnect pattern 10 included in the mask 1 consists of an interconnect part 20 and dummy patterns 30 disposed in a region where patterns of the interconnect part 20 are comparatively sparse. The respective dummy patterns 30 are arranged, for example, at spacing of 8.0 μm and a pitch of 10.0 μm.

As shown in FIG. 1B, the dummy pattern 30 includes three stripe-shaped fine patterns 30a each with a length of approximately 2.0 μm and a width of approximately 0.4 μm, and the three fine patterns 30a arranged at spacing 30b of approximately 0.4 μm between their longer sides are disposed so as to have a plane outline in a square shape of approximately 2.0 μm×2.0 μm. The plane outline of each dummy pattern 30 is a square in this embodiment, which does not limit the invention. Although each dummy pattern 30 includes the three fine patterns 30a, the number of fine patterns 30a is not limited to three but may be two or more.

A method for fabricating a semiconductor device by using the mask 1 having the aforementioned interconnect pattern 10 will now be described with reference to the accompanying drawings.

FIGS. 2A through 2D and 3A through 3C are cross-sectional views for showing procedures in the method for fabricating a semiconductor device having an air gap interconnect structure and including a dummy pattern according to this embodiment.

Figure 2A:
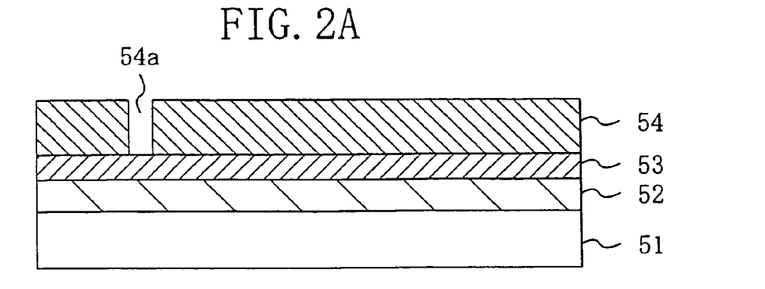
FIGS. 2A, 2B, 2C and 2D are cross-sectional views for showing procedures in a method for fabricating the semiconductor device of Embodiment 1.

First, as shown in FIG. 2A, an underlying insulating film 52 of silicon oxide is deposited all over an interconnect region on a semiconductor substrate 51 of silicon by, for example, plasma CVD. Thereafter, a first interconnect pattern forming layer 53 of aluminum alloy is deposited all over the underlying insulating film 52 by, for example, sputtering. Subsequently, a first insulating film 54 of, for example, silicon oxide is deposited on the first interconnect pattern forming layer 53. Then, a resist film (not shown) is applied on the first insulating film 54, thereby forming a mask pattern for a plug by photolithography. The first insulating film 54 is etched by using the thus formed mask pattern, thereby forming a contact hole 54a in the first insulating film 54.

Figure 2B:
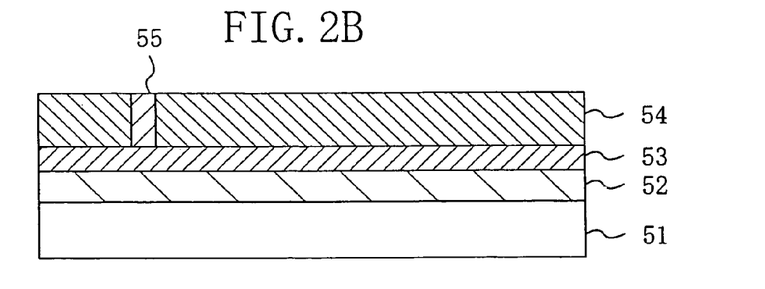

Next, as shown in FIG. 2B, a conducting film of, for example, tungsten is deposited all over the first insulating film 54 including the contact hole 54a by vapor deposition or the like, so as to fill the contact hole 54a with the deposited conducting film. Subsequently, an excessive portion of the conducting film deposited on the first insulating film 54 is polished and removed by CMP, thereby forming a plug 55 of tungsten in the contact hole 54a.

Figure 2C:
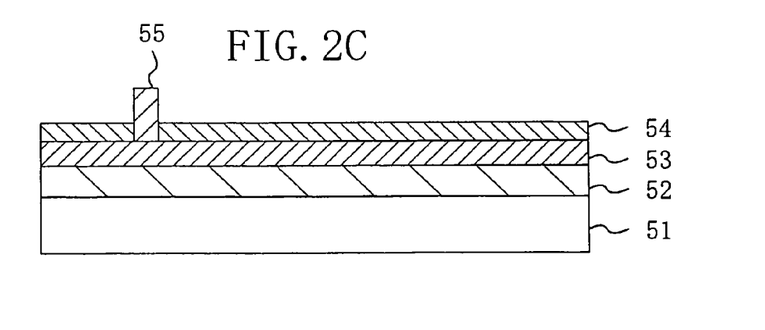

Then, as shown in FIG. 2C, the first insulating film 54 is etched back so that at least an upper portion of the plug 55 can be exposed. The position of the top of an air gap subsequently formed in an interconnect pattern can be determined by controlling the thickness of the first insulating film 54 remaining after the etch back.

Figure 2D:
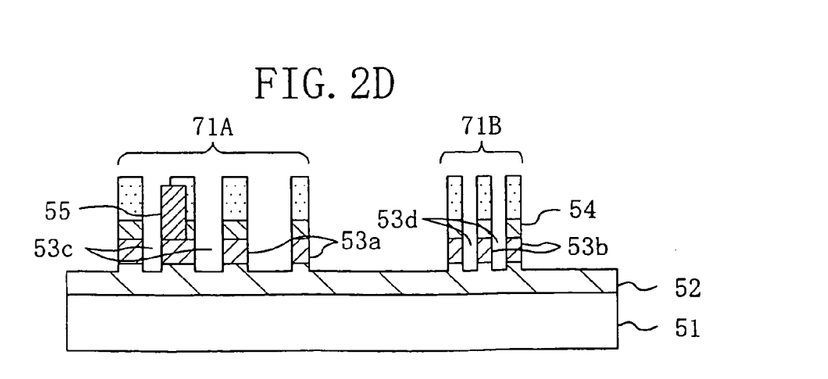

Next, as shown in FIG. 2D, a resist pattern 71A for a first interconnect pattern and a resist pattern 71B for a dummy pattern are formed on the first insulating film 54. By using the resist pattern 71A for a first interconnect pattern and the resist pattern 71B for a dummy pattern as a mask, the first insulating film 54, the first interconnect pattern forming layer 53 and the underlying insulating film 52 are successively etched. Thus, a first interconnect pattern 53a including spaces 53c between adjacent patterns and a dummy pattern 53b electrically insulated from the first interconnect pattern 53a and including three fine patterns each having a stripe plane shape and spaces 53d between adjacent fine patterns are formed from the first interconnect pattern forming layer 53. At this point, portions of the underlying insulating film 52 exposed in the spaces 53c and 53d of the first interconnect pattern 53a and the dummy pattern 53b are trenched by the etching. Therefore, the space 53c of the first interconnect pattern 53a also attains a high aspect ratio and the space 53d of the dummy pattern 53b originally has a high aspect ratio. As a result, air gaps can be easily formed in the spaces 53c in a subsequent procedure and the positions of the air gaps from the substrate surface can be optimized.

Furthermore, since a portion of the underlying insulating film 52 below the side faces of the first interconnect pattern 53a is removed, a lower fringe component of capacitance between adjacent interconnects can be lowered.

Figure 3A:
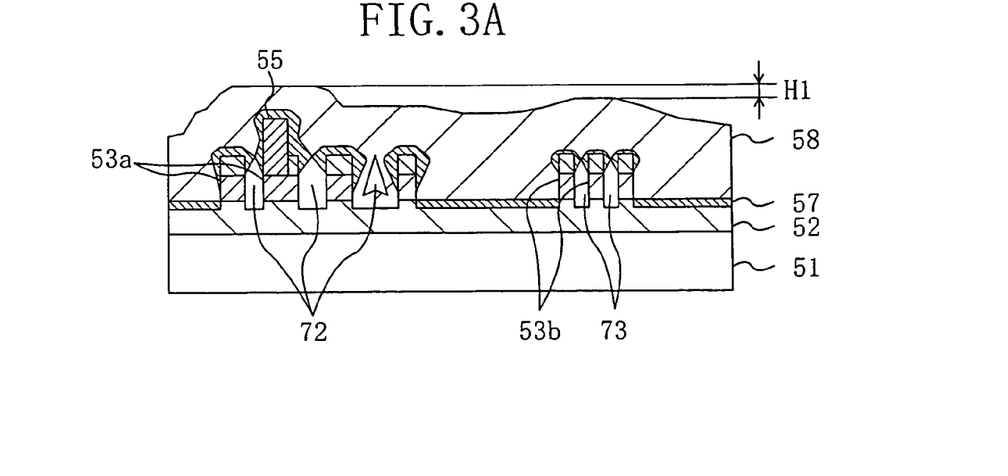
FIGS. 3A, 3B and 3C are cross-sectional views for showing other procedures in the method for fabricating the semiconductor device of Embodiment 1.

Subsequently, as shown in FIG. 3A, after removing the resist patterns 71A and 71B, a second insulating film 57 of silicon oxide for forming air gaps is deposited all over the semiconductor substrate 51 including the plug 55, the first interconnect pattern 53a and the dummy pattern 53b by plasma CVD using a monosilane (SiH$_4$) gas and a dinitrogen monoxide (N$_2$O) gas. At this point, the second insulating film 57 is preferably formed from a film with low coverage and high directivity. When such an insulating film with low coverage is used, the deposited second insulating film 57 overhangs like a peak on the top portions of the adjacent patterns, and hence, an air gap can be definitely formed between the patterns. Thereafter, a third insulating film 58, which may have high coverage, of silicon oxide to be used as an interlayer insulating film is deposited all over the second insulating film 57 by, for example, high density plasma CVD. As a result, air gaps 72 are formed between the patterns of the first interconnect pattern 53a so as to attain the air gap interconnect structure, and air gaps 73 are also formed between the fine patterns of the dummy pattern 53b so that the dummy pattern 53b can also attain the air gap structure.

Also in this embodiment, there is a difference H1 in the absolute height of the top face of the third insulating film 58 between a portion above the first interconnect pattern 53a and a portion above the dummy pattern 53b. However, since the dummy pattern 53b includes a plurality of fine patterns and the spaces 53d are formed between the adjacent fine patterns, a portion of the third insulating film 58 not filled in the spaces 53d rises in the portion above the dummy pattern 53b, and hence, the absolute height of the portion above the dummy pattern 53b is larger than that obtained without employing the air gap structure. The difference Hi is smaller than the difference h1 obtained by the conventional dummy pattern 103b shown in FIG. 8B, and hence, the deposited third insulating film 58 is superior in the planeness on its top face.

Figure 3B:
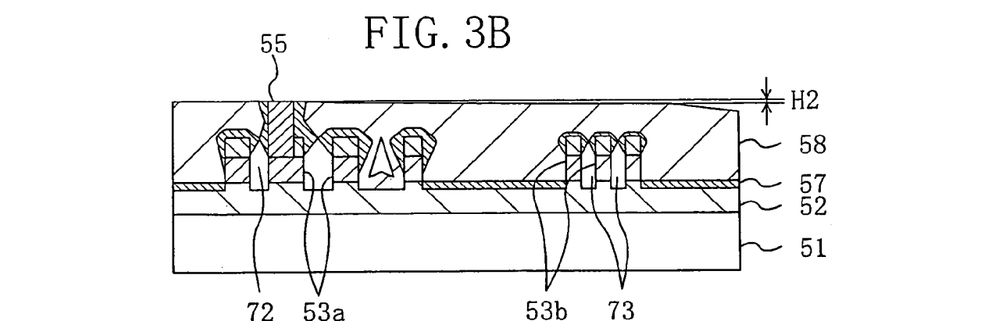

Next, as shown in FIG. 3B, the top face of the third insulating film 58 is polished and planarized by the CMP until the top face of the plug 55 is exposed. At this point, since the difference H1 in the absolute height is sufficiently allowably small, a difference H2 in the absolute height attained after the planarization is very small. Thus, a sufficiently planar face can be obtained.

Figure 3C:
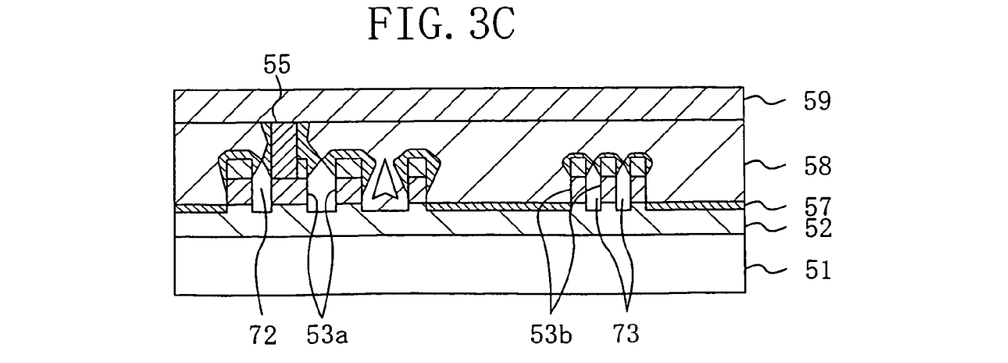

Then, as shown in FIG. 3C, a conducting film electrically connected to the plug 55 is formed on the planarized third insulating film 58 by the sputtering or the like, and a second interconnect pattern 59 is formed from the conducting film. At this point, since the third insulating film 58 is sufficiently planarized, the second interconnect pattern 59 is never disconnected owing to the level difference of the third insulating film 58. Accordingly, the second interconnect pattern 58, that is, an upper layer interconnect pattern, can be definitely formed.

In this manner, according to the fabrication method of Embodiment 1, the dummy pattern 53b including the air gaps 73 between plural fine patterns can be definitely formed in a pattern region where the first interconnect pattern 53a is comparatively sparse in the semiconductor device.

Also, since the second insulating film 57 with high directivity is used for forming the air gaps and the third insulating film 58 with low directivity is used for forming the interlayer insulating film in this embodiment, the controllability in the positions of the tops of the air gaps 72 and 73 can be improved. In addition, even when the interconnects are formed at comparatively large spacing, the air gaps 72 and 73 can be definitely formed. The interlayer insulating film may be formed from a single-layer insulating film, and in this case, a silicon oxide film with relatively low coverage is preferably used as the interlayer insulating film.

Although the two-level interconnect structure including the first interconnect pattern 53a and the second interconnect pattern 59 is formed in this embodiment, the number of the interconnect layers is not limited to two. Any multi-level air gap interconnect structure including three or more layers can be formed by forming a dummy pattern similar to the dummy pattern 53b in a pattern region where the second interconnect pattern 59 is comparatively sparse.

In order to increase the size of the air gap 73 of the dummy pattern 53b, the spacing 30b of the dummy pattern 30 shown in FIG. 1B is preferably set to 0.75 µm or less.

EMBODIMENT 2

A method for fabricating a semiconductor device according to Embodiment 2 of the invention will now be described with reference to the accompanying drawings.

FIGS. 4A through 4C, 5A through 5C and 6A through 6C are cross-sectional views for showing procedures in the method for fabricating a semiconductor device including an air gap dummy pattern according to Embodiment 2.

In Embodiment 2, an interconnect pattern does not include air gaps, and a plug for electrically connecting a lower layer interconnect pattern to an upper layer interconnect pattern is formed after forming the lower layer interconnect pattern and a dummy pattern.

Figure 4A:
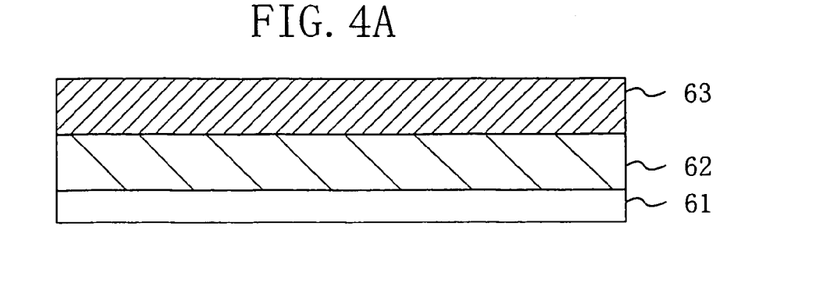
FIGS. 4A, 4B and 4C are cross-sectional views for showing procedures in a method for fabricating a semiconductor device according to Embodiment 2 of the invention.

First, as shown in FIG. 4A, an underlying insulating film 62 of silicon oxide is deposited all over an interconnect region on a semiconductor substrate 61 of silicon by, for example, the plasma CVD. Thereafter, a first interconnect pattern forming layer 63 of aluminum alloy is deposited all over the underlying insulating film 62 by, for example, the sputtering.

Figure 4B:
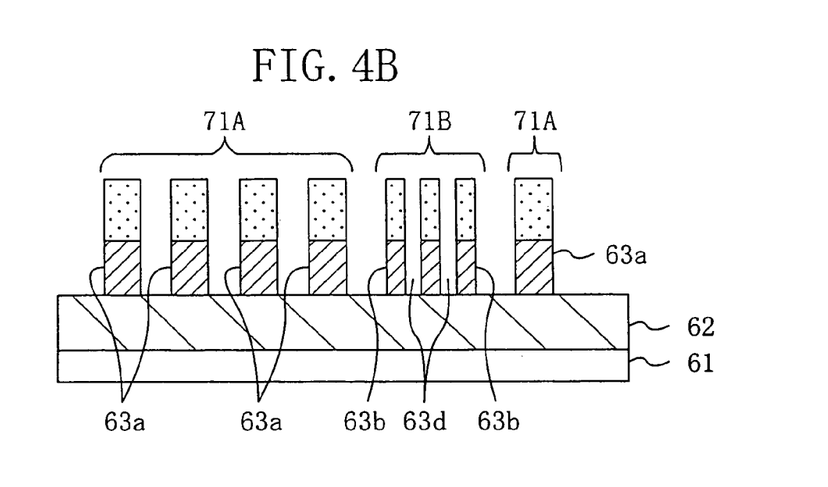

Next, as shown in FIG. 4B, a resist pattern 71A for a first interconnect pattern and a resist pattern 71B for a dummy pattern are formed on the first interconnect pattern forming layer 63 by the photolithography. By using the resist pattern 71A for a first interconnect pattern and the resist pattern 71B for a dummy pattern as a mask, the first interconnect pattern forming layer 63 is etched. Thus, a first interconnect pattern 63a and a dummy pattern 63b electrically insulated from the first interconnect pattern 63a and including three fine patterns each having a stripe plane shape and spaces 63d between adjacent fine patterns are formed from the first interconnect pattern forming layer 63.

Figure 4C:
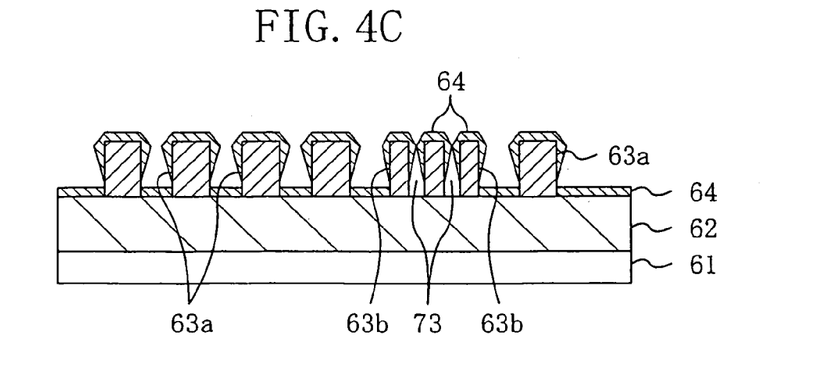

Then, as shown in FIG. 4C, after removing the resist patterns 71A and 71B, a first insulating film 64 of silicon oxide for forming air gaps is deposited all over the semiconductor substrate 61 including the first interconnect pattern 63a and the dummy pattern 63b by the plasma CVD using a monosilane ($SiH_4$) gas and a dinitrogen monoxide ($N_2O$) gas. At this point, the first insulating film 64 is preferably formed from a film with low coverage and high directivity. When such an insulating film with low coverage is used, the deposited first insulating film 64 overhangs like a peak on the top portions of the adjacent fine patterns of the dummy pattern 63b, and hence, air gaps can be definitely formed between the fine patterns.

Thereafter, as shown in FIG. 5A, a second insulating film 65, which may be an insulating film with comparatively high coverage, of silicon oxide to be used as an interlayer insulating film is deposited all over the semiconductor substrate 61 including the first insulating film 64 by the high density plasma CVD. Thus, air gaps 73 are formed between the fine patterns of the dummy pattern 63b, and the dummy pattern 63b attains the air gap structure.

Since the dummy pattern 63b thus includes a plurality of fine patterns and the air gaps 73 provided between the adjacent fine patterns, the second insulating film 65 is not filled in the air gaps 73 of the dummy pattern 63b. Therefore, a difference H1 in the absolute height becomes smaller than in the conventional dummy pattern including no air gaps. As a result, the deposited second insulating film 65 attains good planeness on its top face.

Next, as shown in FIG. 5B, the top face of the second insulating film 65 is polished and planarized by the CMP. At this point, since the difference H1 in the absolute height attained before the polishing is sufficiently small, a difference H2 in the absolute height attained after polishing and planarizing the top face of the second insulating film 65 is very small. Thus, a sufficiently planar face can be obtained.

Figure 5C:
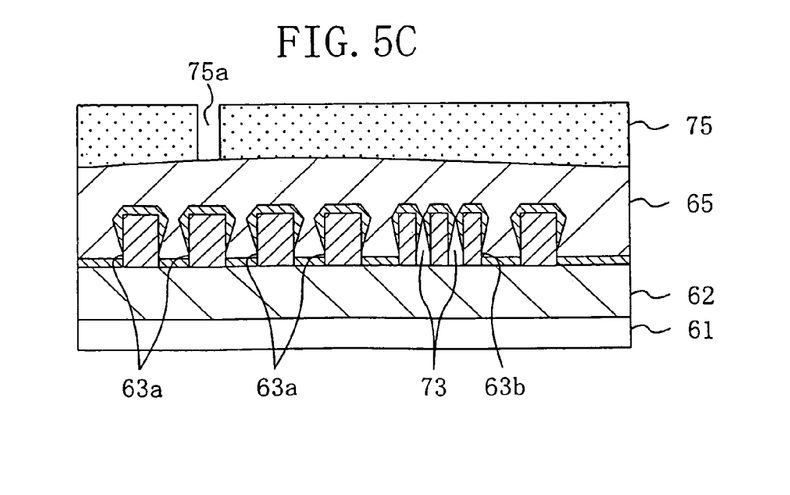

Then, as shown in FIG. 5C, a resist film is applied on the second insulating film 65, and a mask pattern 75 for a plug having an opening 75a above the first interconnect pattern 63a is formed by the photolithography.

Figure 6A:
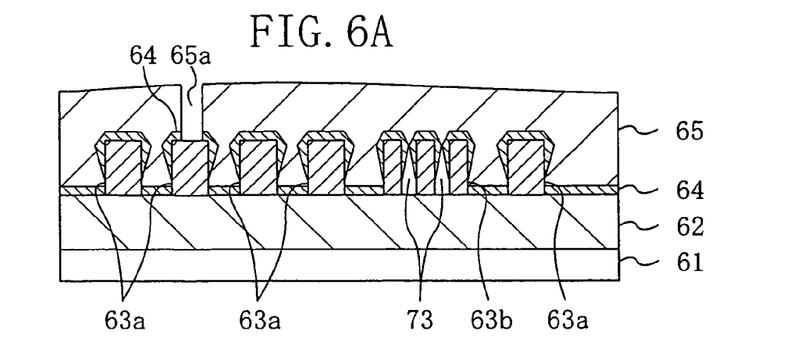
FIGS. 6A, 6B and 6C are cross-sectional views for showing still other procedures in the method for fabricating a semiconductor device of Embodiment 2.

Subsequently, as shown in FIG. 6A, the second insulating film 65 and the first insulating film 64 are etched by using the mask pattern 75 for a plug, thereby forming a contact hole 65a in the second insulating film 65 above an interconnect of the first interconnect pattern 63a.

Figure 6B:
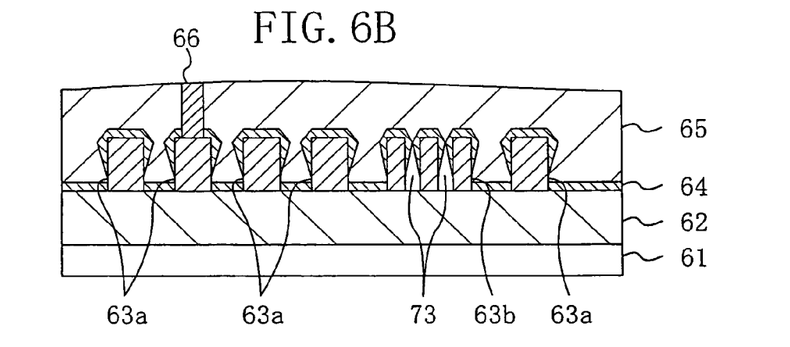

Next, as shown in FIG. 6B, a conducting film of, for example, tungsten is deposited all over the second insulating film 65 including the contact hole 65a by the vapor evaporation or the like, so as to fill the deposited conducting film in the contact hole 65a. Subsequently, an excessive portion of the conducting film deposited on the second insulating film 65 is polished and removed by the CMP, thereby forming a plug 66 of tungsten in the contact hole 65a.

Figure 6C:
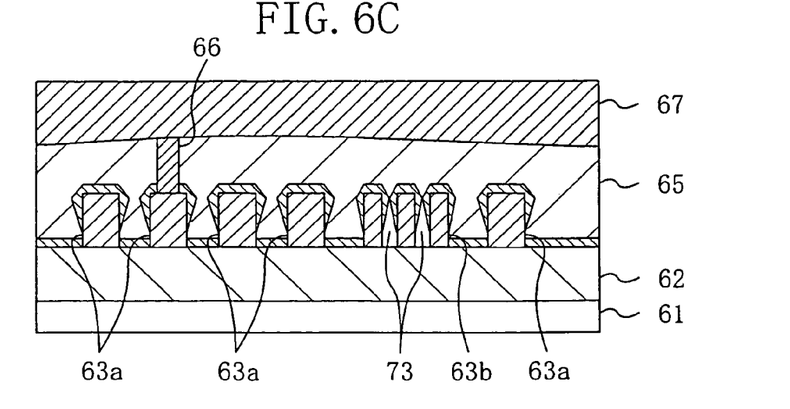

Then, as shown in FIG. 6C, a conducting film electrically connected to the plug 66 is formed on the planarized second insulating film 65 by the sputtering or the like, and a second interconnect pattern 67 is formed from the conducting film. At this point, since the second insulating film 65 is sufficiently planarized, the second interconnect pattern 67 is never disconnected owing to a level difference in the second insulating film 65. Thus, the second interconnect pattern 67, that is, an upper interconnect pattern, can be definitely formed.

In this manner, according to the fabrication method of Embodiment 2, the dummy pattern 63b including the air gaps 73 between a plurality of fine patterns can be definitely formed in a pattern region where the first-interconnect pattern 63a is comparatively sparse in the semiconductor device.

Also, since the first insulating film 64 with high directivity is used for forming the air gaps and the second insulating film 65 with low directivity is used for forming the interlayer insulating film in this embodiment, the controllability in the positions of the tops of the air gaps 73 can be improved. In addition, even when the spacing between the fine patterns of the dummy pattern 63b is comparatively large, the air gaps 73 can be definitely formed. The interlayer insulating film may be formed from a single-layer film, and in this case, a silicon oxide film with relatively low coverage is preferably used for the interlayer insulating film.

Although the two-level interconnect structure including the first interconnect pattern 63a and the second interconnect pattern 67 is formed in this embodiment, the number of layers of the interconnects is not limited to two. Any multi-level air gap interconnect structure including three or more layers can be formed by forming a dummy pattern similar to the dummy pattern 63b in a pattern region where the second interconnect pattern 67 is comparatively sparse.

In order to increase the size of the air gap 73 of the dummy pattern 63b, the spacing 30b of the dummy pattern 30 shown in FIG. 1B is preferably set to 0.75 μm or less.

What is claimed is:

1. A semiconductor device, comprising:
a first insulating film formed on a semiconductor substrate;
an interconnect layer formed on the first insulating film and having an interconnect pattern and a dummy pattern; and
a second insulating film formed on and between the interconnect pattern and the dummy pattern,
wherein the dummy pattern includes a plurality of fine patterns each of which are smaller than the interconnect pattern and air gaps sandwiched between the adjacent fine patterns, and an interconnection of the dummy pattern has a width and spacing smaller than a width and spacing of the interconnection of the interconnect pattern.

2. The semiconductor device of claim 1, wherein the dummy pattern is formed in a region where the interconnect pattern is relatively sparse.

3. The semiconductor device of claim 1, wherein the interconnect pattern and the dummy pattern are electrically insulated from each other.

4. The semiconductor device of claim 1, further comprising a third insulating film between the dummy pattern and the second insulating film, the third insulating film overhanging an upper portion of an interconnection in the dummy pattern to provide the air gap between adjacent interconnections.

5. The semiconductor device of claim 1, wherein in the dummy pattern, a plurality of linear interconnections are provided with a spacing therebetween.

* * * * *